US006647075B1

(12) United States Patent
Genrich

(10) Patent No.: US 6,647,075 B1
(45) Date of Patent: Nov. 11, 2003

(54) DIGITAL TUNER WITH OPTIMIZED CLOCK FREQUENCY AND INTEGRATED PARALLEL CIC FILTER AND LOCAL OSCILLATOR

(75) Inventor: Thad J. Genrich, Aurora, CO (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/527,798

(22) Filed: Mar. 17, 2000

(51) Int. Cl.[7] ............................................. H04L 27/22
(52) U.S. Cl. ............................................. 375/316
(58) Field of Search ............................. 375/316, 350, 375/349; 455/150.1

(56) References Cited

U.S. PATENT DOCUMENTS

| | | | |
|---|---|---|---|
| 3,969,615 A | 7/1976 | Bowers et al. | 235/151.11 |
| 4,077,063 A | 2/1978 | Lind | 364/729 |
| 4,346,477 A * | 8/1982 | Gordy | 455/257 |
| 4,486,846 A | 12/1984 | McCallister et al. | 364/607 |
| 4,787,058 A | 11/1988 | Schmars | 364/807 |
| 4,809,205 A | 2/1989 | Freeman | 364/721 |
| 4,926,443 A | 5/1990 | Reich | 375/102 |
| 4,975,699 A | 12/1990 | Frey | 341/118 |
| 5,027,087 A | 6/1991 | Rottinghaus | 332/127 |
| 5,111,162 A | 5/1992 | Hietala et al. | 332/127 |
| 5,146,418 A | 9/1992 | Lind | 364/729 |
| 5,204,676 A | 4/1993 | Herrmann | 341/61 |

(List continued on next page.)

FOREIGN PATENT DOCUMENTS

| | | | |
|---|---|---|---|
| DE | 196 16 368 C1 | 12/1997 | H03D/3/02 |
| EP | 0 102 784 A2 | 3/1984 | G06F/1/02 |
| EP | 0 392 229 A2 | 3/1990 | H04L/25/06 |
| EP | 0 889 595 A1 | 6/1998 | H03L/7/18 |
| EP | 0 926 857 A2 | 6/1999 | H04L/7/02 |
| GB | 2152715 A | 8/1985 | G06F/7/548 |
| WO | WO 86/06517 | 11/1986 | G06F/1/02 |
| WO | WO 92/02872 | 2/1992 | G06F/1/035 |
| WO | WO 99/23760 | 5/1999 | H04B/1/16 |
| WO | WO 99/49582 | 9/1999 | H04B/1/10 |

OTHER PUBLICATIONS

"Method and System for Generating a Trigonometric Function", Specification, Claims and Abstract (30 pages), 2 pages of drawings, inventor Thad J. Genrich, filed Jul. 27, 1999, U.S. Appln. Ser. No. 09/361,917.

(List continued on next page.)

Primary Examiner—Stephen Chin
Assistant Examiner—Kevin Kim
(74) Attorney, Agent, or Firm—Baker Botts L.L.P.

(57) ABSTRACT

A digital tuner 70 for maximizing tuning range for a particular intermediate frequency includes an analog to digital converter (78) operating at an input clock frequency to sample an analog input signal (76) and output a multi-bit digital word for each sample, a demultiplexer (82) in communication with the analog to digital converter (78) and a plurality of mixers (84) to convert serial samples from the analog to digital converter (78) to parallel samples for input to the mixers (84) functioning as quadrature multipliers, local oscillators (86) in communication with corresponding ones of the mixers (84), and a parallel cascaded integrator comb filter (72, 74) in communication with the mixers (84) for filtering and decimating the parallel samples, where the mixers (84), the local oscillators (86), and the filter (72, 74) operate at a frequency having adjacent harmonics substantially centered about the intermediate frequency. A method for determining an operating frequency for a digital tuner having an associated intermediate frequency to reduce clock harmonic interference includes determining a maximum frequency based on operating parameters of tuner elements, selecting a harmonic of the operating frequency based on the intermediate frequency and the maximum frequency, and selecting the operating frequency based on the intermediate frequency.

9 Claims, 3 Drawing Sheets

U.S. PATENT DOCUMENTS

| | | | | |
|---|---|---|---|---|
| 5,249,204 | A | | 9/1993 | Funderburk et al. .......... 375/97 |
| 5,276,633 | A | | 1/1994 | Fox et al. ................... 364/721 |
| 5,315,620 | A | | 5/1994 | Halawani et al. ........... 375/102 |
| 5,446,923 | A | * | 8/1995 | Martinson et al. .......... 455/330 |
| 5,483,203 | A | | 1/1996 | Rottinghaus ................. 331/10 |
| 5,504,751 | A | | 4/1996 | Ledzius et al. .......... 370/100.1 |
| 5,517,529 | A | | 5/1996 | Stehlik ....................... 375/316 |
| 5,596,609 | A | | 1/1997 | Genrich et al. ............. 375/350 |
| 5,697,068 | A | | 12/1997 | Salvi et al. ................... 455/76 |
| 5,752,174 | A | * | 5/1998 | Matai et al. ............. 455/183.1 |
| 5,790,601 | A | | 8/1998 | Corrigan, III et al. ...... 375/302 |
| 5,812,940 | A | | 9/1998 | Lindell ....................... 455/114 |
| 5,815,117 | A | | 9/1998 | Kolanek ..................... 342/442 |
| 5,894,592 | A | | 4/1999 | Brueske et al. ............... 455/86 |
| 5,991,605 | A | | 11/1999 | Rapeli ......................... 455/76 |
| 6,028,493 | A | | 2/2000 | Olgaard et al. ............. 332/103 |
| 6,055,280 | A | | 4/2000 | Genrich ...................... 375/325 |
| 6,081,570 | A | | 6/2000 | Ghuman et al. ............ 375/368 |
| 6,133,804 | A | | 10/2000 | Wagner et al. .............. 332/127 |
| 6,298,093 | B1 | | 10/2001 | Genrich ...................... 375/271 |
| 6,366,225 | B1 | | 4/2002 | Ozdemir ..................... 341/111 |

OTHER PUBLICATIONS

Gardner, F.M., "*Interpolation in Digital Modems/Part I: Fundamentals*", IEEE Transactions on Communications, IEEE Inc., New York, vol. 41, No. 3, Mar. 1, 1993 (pp. 501–507), XP000372693.

"*Apparatus and Method for Quadrature Tuner Error Correction*", Specification, Claims and Abstract (32 pages), drawings (3 pages), Application Ser. No. 09/538,354 filed Jul. 21, 1999, inventor Thad J. Genrich.

"*Parallel Asynchronous Sample Rate Reducer*", Specification, Claims and Abstract (24 pages), drawings (6 pages), Application Ser. No. 09/527,411 filed Mar. 17, 2000, inventor Thad J. Genrich.

International Search Report dated Oct. 23, 2001 for PCT/US 01/08478 filed Mar. 15, 2001.

Aschwanden, Felix, Manuscript, "*Direct Conversion—How to Make it Work in TV Tuners*", Laboratories RCA Ltd., Badenerstrasse 569, CH 8048, Zurich Switzerland, IEEE Transactions on Consumer Electronics, vol. 42, No. 3, Aug. 1996, pp. 729–738.

PCT International Search Report dated Nov. 10, 2000 for PCT/US 00/20060 filed Jul. 21, 2000.

PCT International Search Report dated Nov. 15, 2000 for PCT/US 00/21016 filed Aug. 01, 2000.

Hogenauer, Eugene B., "An Economical Class of Digital Filters for Decimation and Interpolation", IEEE Transactions on Acoustics, Speech, and Signal Processing, Apr. 1981, vol. ASSP–29, No. 2, 9 pages.

* cited by examiner

DIGITAL TUNER WITH OPTIMIZED CLOCK FREQUENCY AND INTEGRATED PARALLEL CIC FILTER AND LOCAL OSCILLATOR

TECHNICAL FIELD OF THE INVENTION

The present invention relates to high performance digital tuners having high sample rate parallel cascaded-integrator-comb filters.

BACKGROUND OF THE INVENTION

Digital filters are used in a variety of communication systems which typically transmit and receive amplitude and/or phase modulated signals across a communication channel. Of course, the class or type of filter utilized depends upon the requirements of the particular application. Some applications, including those having phase modulated communication protocols, require filters with a constant group delay over the frequency range of interest, i.e. filters with a linear phase characteristic. Finite impulse response (FDR) filters may be designated with a linear phase characteristic while also providing selectable frequency characteristics. These filters are typically implemented using an array of multipliers to multiply various coefficients by consecutive input samples to achieve an overall desired frequency response. However, for many applications, FIR filter implementations are more complex and require more power than a cascaded-integrator-comb (CIC) filter having similar characteristics.

As described in detail in E. B. Hogenauer, "An Economical Class of Digital Filters for Decimation and Interpolation," IEEE Transactions on Acoustics, Speech and Signal Processing, Volume ASSP-29, No. 2, April 1981, pp. 155–162, and hereby incorporated by reference, CIC filters provide the same frequency response as several cascaded FIR Filters operating at the input sample rate followed by a downsampler. The number of cascaded stages is selected based on predetermined design requirements for aliasing or imaging error. However, the CIC filters may be implemented with significantly simpler logic than analogous FIR digital filters because the CIC implementation requires no multipliers and uses only limited storage. The reduced number of logic gates required for implementation improves efficiency and requires significantly less power. However, serial implementations for CIC filters as described by Hogenauer have limited sampling rates.

A parallel processing implementation for integrator stages of a CIC filter is described in detail in U.S. Pat. No. 5,596,609, the disclosure of which is hereby incorporated by reference in its entirety. The parallel CIC (PCIC) structure replaces serial integrators with parallel versions which can process effective input sample rates that are P times higher than a standard integrator clock rate, where P represents the number of parallel data words. Input samples are demultiplexed such that consecutive samples are applied to sequential inputs of the parallel structure. Adder and accumulator blocks include output pipeline registers to provide maximum operational speed with appropriate register blocks to equalize pipeline delays for the various paths. The PCIC structure is easily cascadeable since it allows subsequent integrator stages access to intermediate samples generated by preceding integrator stages. The parallel integrator structure may be implemented directly or maybe reduced in complexity by removing redundant logic for use in decimator output sections or interpolator input sections. The parallel implementation of a CIC filter allows much higher sample rate filtering to be implemented with fewer standard CMOS logic devices because the PCIC filter processes an effective input sample rate which is P times the input clock frequency. While the maximum input clock frequency depends upon the particular hardware or software used to implement the filter, potential clock harmonic interference may limit the tunable bandwidth and/or performance of the filter.

SUMMARY OF THE INVENTION

The present invention provides a PCIC based tuner with an input clock rate enabling a wide tuning bandwidth to reduce or minimize clock harmonic interference.

The present invention also provides a method for selecting an input clock rate for a PCIC-based tuner which maximizes tuning bandwidth while minimizing clock harmonic interference.

In accordance with the present invention, there is provided a digital tuner designed to maximize tuning range for a particular intermediate frequency. The digital tuner includes an analog to digital converter operating at an input clock frequency to sample an analog input signal and produce a multi-bit digital word for each sample, a demultiplexer in communication with the analog to digital converter converts serial samples from the analog to digital converter to parallel samples for input to a plurality of mixers. A plurality of local oscillators interconnected to corresponding ones of the plurality of mixers, and a parallel cascaded integrator comb filter coupled to the plurality of mixers filters and decimates the parallel samples wherein the mixers, the local oscillators, and the filter operate at a frequency having adjacent harmonics substantially centered about the intermediate frequency. In one embodiment, a tuner for use with a phase modulated signal includes a plurality of quadrature multipliers functioning as mixers and driven by coherent local oscillators each including a phase accumulator and cosine/sine look-up tables. Separate PCIC filters are provided for filtering and decimating the resulting phase (I) and quadrature (Q) signals for direct application to a demodulator, or to a decimating CIC or FIR filter for subsequent sample rate reduction. Preferably, the local oscillators, quadrature multipliers and PCIC filters are incorporated into a single programmable logic device, such as a field programmable gate array (FPGA), an embedded programmable logic device (EPLD), or application-specific integrated circuit (ASIC).

A method for determining an operating frequency for a digital tuner having an associated intermediate frequency to reduce clock harmonic interference includes determining a maximum frequency based on operating parameters of tuner elements, selecting a harmonic of the operating frequency based on the intermediate frequency and the maximum frequency, and selecting the operating frequency based on the intermediate frequency and the selected harmonic to enhance tuning bandwidth and reduce clock harmonic interference.

The present invention provides a number of advantages for PCIC filter applications including digital tuners. For example, selection of a clock frequency according to the present invention is based on harmonics around the intermediate frequency to enhance the tuning range without potential clock harmonic interference. Implementation of a local oscillator including a phase accumulator and sine/cosine look-up tables, in addition to mixer multipliers and one or more PCIC filters reduces the number of logic devices needed to implement a digital tuner. Tuners constructed according to the present invention are particularly suited for use as telemetry receivers requiring a wide tuning bandwidth, low spurious levels, and constant group delay characteristics. Furthermore, the high sampling rate afforded by the present invention eases design requirements for anti-aliasing filters while providing greatly improved group delay characteristics compared to an under sampled approach. Direct sampling also eliminates the oscillators and mixers required for analog tuning techniques which can generate undesired spurious signals through harmonics, coupling, and mixing processes.

The present invention will be readily appreciated by one of ordinary skill in the art from the following detailed description of the best mode for carrying out the invention when taken in connection with the accompanying drawings.

DETAILED DESCRIPTION OF THE DRAWINGS

Figure 1:
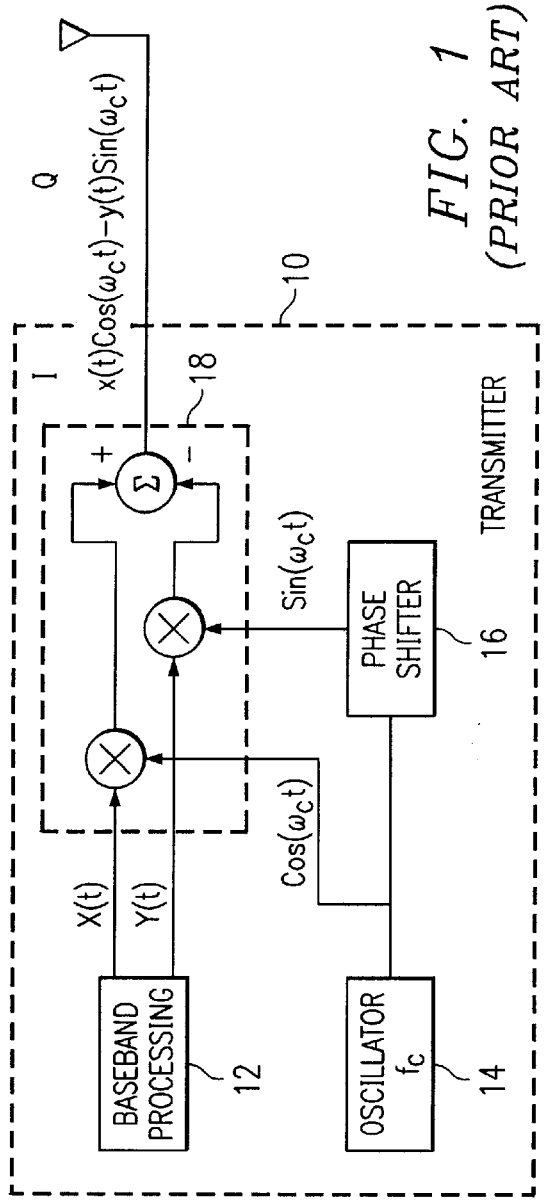
FIG. 1 is a block diagram of a transmitter having a digital tuner for use in a communication system according to the present invention.
Figure 2:
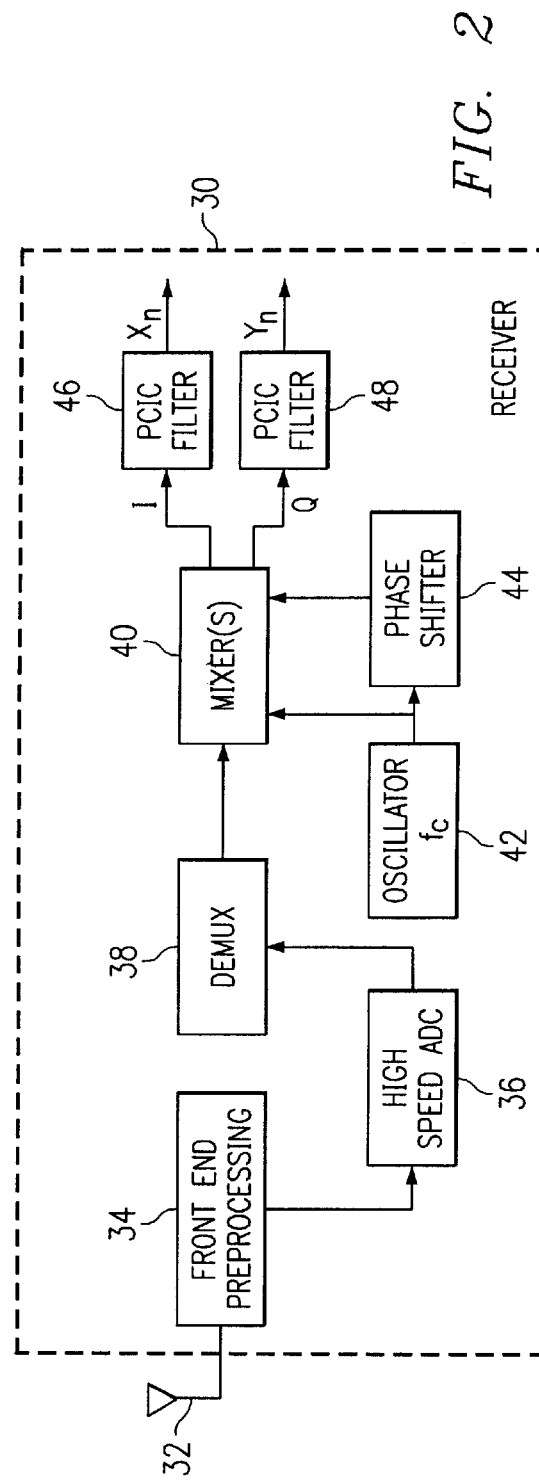
FIG. 2 is a block diagram of a receiver utilizing a digital tuner having an enhanced tuning range according to the present invention.

Referring now to FIGS. 1 and 2, block diagrams illustrate a representative communication system including a receiver having a digital filter constructed in accordance with the present invention. Transmitter 10 of FIG. 1 utilizes quadrature modulation (also referred to as in-phase and quadrature or I and Q modulation) to transmit a signal over a communication channel. Transmitter 10 includes a baseband processor 12 generating and/or processing a baseband signal having time-varying components x(t) and 7(t). Oscillator 14 generates a sinusoidal carrier signal (represented by cos ($\omega_c$t)) at a carrier frequency $f_c$, (where $\omega_c=2\pi f_c$). A phase shifter 16 imparts a 90° ($\pi/2$) phase shift to the oscillator signal to produce a shifted oscillator signal (represented by sin ($\omega_c$t)).

As also illustrated in FIG. 1, the oscillator signals (shifted and unshifted) are multiplied with the baseband signal components y(t) and x(t), respectively, by mixer 18. The components of the multiplication are summed to produce a complex modulated in-phase and quadrature signal for transmission via antenna 20 over a communication channel. Of course, FIG. 1 is an illustration of a generalized transmitter. In practice, transmitter 10 includes a number of other functional blocks not specifically illustrated, such as amplifiers, filters, multiplexers, and the like. Furthermore, transmitter 10 may transmit an analog signal as illustrated or may be implemented using any of a number of known digital transmission schemes.

Referring now to FIG. 2, receiver 30 receives a signal transmitted over a communication channel via antenna 32. In some applications, optional RF front end preprocessing 34 performs various analog processing of the received signal to ease requirements of other system components such as high speed analog-to-digital converter (ADC) 36 and digital filters 46 and 48. RF front end preprocessing 34 typically includes mixers and local oscillators to perform frequency conversion, automatic gain control (AGC) amplifiers, anti-aliasing filters and the like. High-speed ADC 36 converts the received analog signal to a digital signal which is demultiplexed by DEMUX 38. Mixer 40 separates the demultiplexed signal into in-phase and quadrature components utilizing oscillator signals generated by oscillator 42 and phase shifter 44. A direct digital synthesizer having sine and cosine outputs could be utilized in phase of oscillator 42 and phase shifter 44. Digital filters 46 and 48 are low-pass PCIC filters for generating digital sequences for utilization to reconstruct the original baseband signal components x(t) and y(t) from corresponding samples $X_n$ and $Y_n$.

Figure 3:
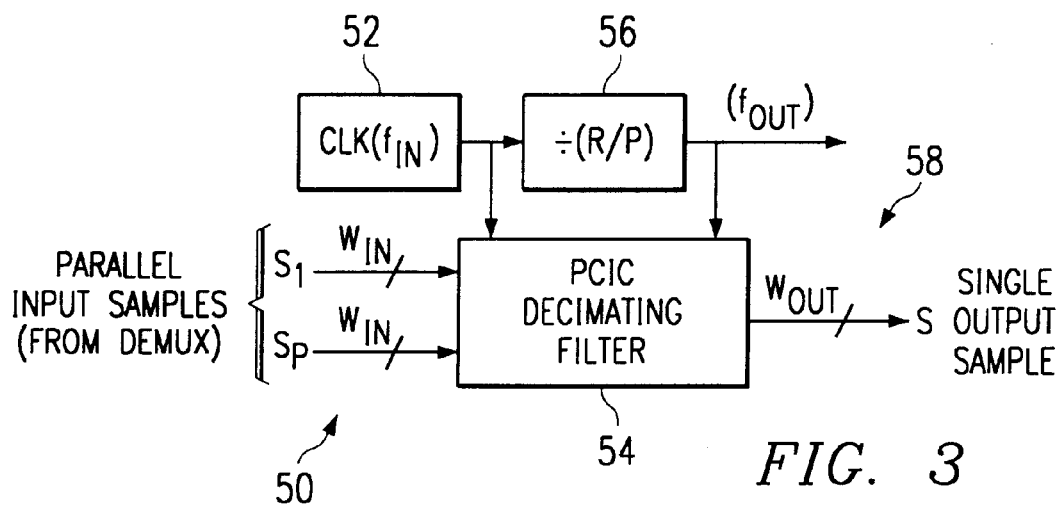
FIG. 3 is a block diagram illustrating connections for a parallel CIC decimation filter.

Referring now to FIG. 3, there is shown a block diagram illustrating connections for a decimating PCIC filter according to the present invention. The input data, indicated generally by reference numeral 50, includes P parallel multibit sample words ($S_1$ through $S_P$) each having $W_{IN}$ bits. A clock 52 generates a clocking signal at a clock rate of $f_{IN}$ hertz (Hz). Parallel input data 50 represents P consecutive samples from a $W_{IN}$ bit digitizer or processor operating at an effective word serial rate of $P*f_{IN}$ Hz. Both the parallel input data 50 and the clock signal are input to a PCIC decimating filter 54. The input clock signal from clock 52 is effectively divided, as presented generally by block 56, based on the number of parallel samples (P) and the decimation ration (R) of PCIC filter 54 outputs a single sample word 58 (S) having $W_{OUT}$ bits at a frequency of $F_{OUT}=P*f_{IN}/R$. The decimation ration R must be an integer multiple of the number of parallel input samples P. The major advantage of PCIC filter 54 is the ability to process an effective input sample rate at P times the input clock frequency $f_{IN}$. PCIC filter 54 is typically constructed using only adders, subtractors, and registers, i.e. without multipliers, thereby drastically reducing gate count, power consumption, and cost when compared to an equivalent FIR filter implementation. The PCIC filter also exhibits a linear phase response making it particularly suited for processing of phase modulated signals. A PCIC filter implemented with Complementary Metal Oxide Semiconductor (CMOS) logic elements incorporated into a gate array, custom application specific integrated circuit (ASIC), or field programmable gate array (FPGA) provides effective input sample rates exceeding 400 MSPS.

Figure 4:
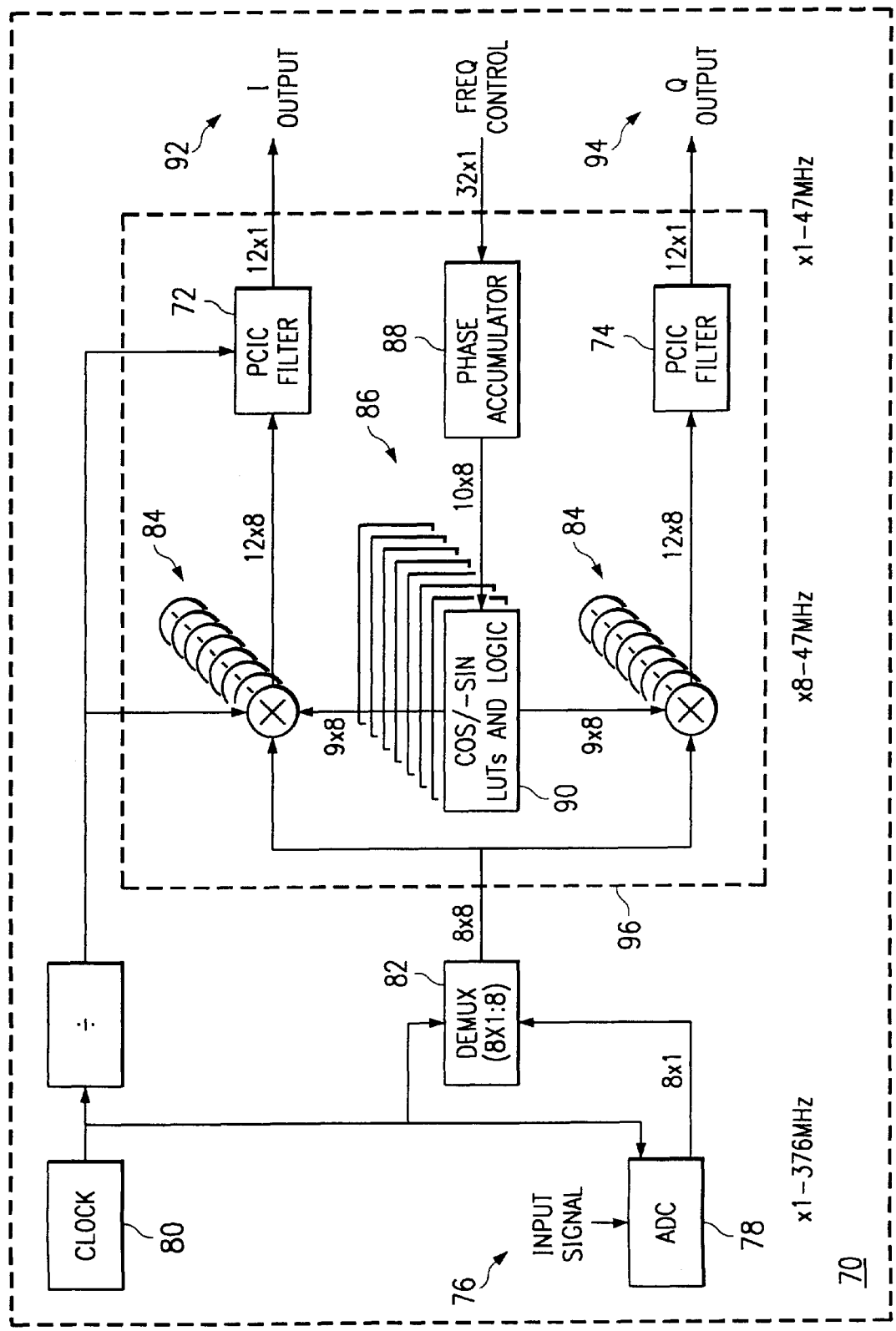
FIG. 4 is a block diagram illustrating a digital tuner having an enhanced tuning range with integral oscillators and PCIC filters according to the present invention.

A block diagram illustrating one embodiment of a digital tuner having an enhanced bandwidth according to the present invention is shown in FIG. 4. This embodiment illustrates a typical application of a digital tuner in a communication system employing a phase modulated communication protocol. An in-phase PCIC filter 72 processes the in-phase (I) component of the signal while a quadrature-phase PCIC filter 74 processes the quadrature (Q) component of the signal. The number of PCIC filter stages within filters 72 and 74 is determined by the requirements of the particular application. To maintain a fixed worst case aliasing attenuation specification requires an increasingly larger number of PCIC stages as the ratio of signal bandwidth to sample rate increases. To improve the bandwidth to be tuned without potential clock harmonic interference, the clocking frequency or clock rate is preferably determined according to the present invention such that the intermediate frequency of tuner 70 is substantially centered between adjacent harmonics of the clocking frequency. The bandwidth that can be tuned is then equal to the difference between the adjacent harmonics. The maximum clocking rate will be limited by the particular implementation including the type of logic elements and/or software and operating system for algorithmic processing implementations. Clock rate selection is illustrated and described in detail with reference to FIG. 5.

In the embodiment illustrated in FIG. 4, a clock rate of 47 MHZ is used to center a 70 MHz nominal intermediate frequency between adjacent harmonics of the clock frequency, i.e. the fundamental (47 MHz) and the second harmonic (94 MHz). Table 1 summarizes the number of stages (N) required to maintain at least 90 dB of worst case alias attenuation for three different signal bandwidths, as well as the corresponding overall band edge and alias attenuation assuming a decimation ratio (R) of 8, a maximum operating frequency of 376 MHz, and 8 parallel samples of 8 bits each.

TABLE 1

PCIC Stages vs. Signal Bandwidth

| Signal Bandwidth (2 sided) | Signal Bandwidth (1 sided) | 1 Sided Signal Bandwidth/ Sample Rate | Filter Sections Required (N) | Band Edge Attenuation (dB) | Worst Case Alias Attenuation (dB) |
|---|---|---|---|---|---|
| 100 KHz | 50 KHz | $1.064 \times 10^{-3}$ | 2 | <0.01 | 118.5 |
| 1 MHZ | 500 KHz | $1.064 \times 10^{-2}$ | 3 | <0.01 | 117.5 |
| 10 MHZ | 5 MHZ | $1.064 \times 10^{-1}$ | 5 | 0.80 | 92.4 |

(Note: $f_{IN}$ = 47 MHZ, P = 8, R = 8)

As illustrated in FIG. 4, an analog input signal, represented generally by reference numeral 76, is sampled or digitized by an eight-bit analog to digital converter (ADC) 78 clocked at the maximum frequency for this particular implementation of 376 MHz based on a clocking signal from clock 80. Output signals from ADC 78 are demultiplexed into eight parallel samples of multi-bit data words each having eight bits by demultiplexer 82. Output samples from demultiplexer 82 are provided to a plurality of mixers 84 at a frequency of 47 MHz (376÷8). Preferably the mixers 84 are implemented as quadrature multipliers driven by corresponding ones of a plurality of local oscillators, indicated generally by reference numeral 86. Local oscillators 86 include a phase accumulator 88 and eight pairs of cosine/sine look-up tables and associated logic 90. For applications requiring greater precision, the cosine/sine values are determined algorithmically rather than using look-up tables. Phase accumulator 88 receives a 32 bit frequency control signal and provides a 10 bit control signal to each of the eight pairs of look-up tables 90. Mixers 84 separate the in-phase and quadrature components of the input signal and the separated components are then provided to corresponding PCIC filters 72 and 74, respectively. PCIC filters 72 and 74, having a decimation ratio (R) of eight, filter and decimate the signal resulting in a multi-bit serial output sample rate of 47 MHz with each sample having twelve bits. The decimated in-phase component 92 and quadrature component 94 can be directly applied to a demodulator function, or to a decimating (serial CIC or FIR filter for further sample rate reduction.

Preferably, logic elements used to implement mixers 84, local oscillators 86, and PCIC filters 72 and 74 are contained within a single logic device such as a field programmable gate array, an application-specific integrated circuit, or embedded programmable logic device, represented generally by reference numeral 96.

The local oscillators 86 and multiplier functions of mixers 84 can be decomposed into four basic logic elements or components for the purposes of estimating the total number of gates necessary for implementation. Table 2 lists each component and the number of components required for each function. The overall totals for each component are then multiplied by an estimated component gate count to arrive at a total gate estimate for the two functions.

TABLE 2

LO/Multiplier Gate Estimate

| Function | ROM bits | 2-input AND gates | Full adder bits | D flip flop's |
|---|---|---|---|---|
| Phase accum. logic | | | 145 | 200 |
| cos/sin LUTs & logic (16 outputs) | 32,768 | | 304 | 282 |
| Pipelined multipliers (16 total) | | 1,024 | 1,184 | 2,880 |
| Component Totals | 32,768 | 1,024 | 1,633 | 3,362 |
| Est. gates per component | 1 | 1 | 10 | 10 |
| Total est. gates by component | 32,768 | 1,024 | 16,330 | 33,620 |
| Total estimated gates | | | | 83,742 |

The PCIC filters 72 and 74 are typically implemented with full adder and D flip flop components. Depending upon the particular application performance requirements, the PCIC filters may include additional stages. Table 3 shows the number of components required for the filters having two, three, and five stages, and provides gate estimates based on the assumption of 10 gates per full adder bit or D flip flop. The last column of Table 3 provides overall totals for a digital tuner according to the present invention incorporating a local oscillator, sixteen quadrature multipliers, and two PCIC filters as illustrated in FIG. 4 for filters having two, three, or five filter stages. All three tuners are readily implemented in current CMOS gate array or custom ASIC technologies.

enhancing tuning bandwidth of the tuner. A maximum frequency is determined based on operating parameters of logic elements used to implement tuner functions as represented by block 110. The selected clocking frequency must be less than or equal to the maximum frequency as represented by:

TABLE 3

Tuner Gate Estimates

| Filter Stages | Full Adder Bits (Filter) | Full Adder Gates (Filter) | D Flip Flops (Filter) | D Flip Flop Gates (Filter) | Total Gates (Filter) | Tuner Filter Gates (2 Tuners each, I & Q) | LO/ Mult. Gates | Total Gates (2 tuners + LO/Multipliers) |
|---|---|---|---|---|---|---|---|---|
| 2 | 461 | 4,610 | 612 | 6,120 | 10,730 | 21,460 | 83,742 | 105,202 |
| 3 | 875 | 8,750 | 1,244 | 12,440 | 21,190 | 42,380 | 83,742 | 126,122 |
| 5 | 1,937 | 19,370 | 2,880 | 28,800 | 48,250 | 96,500 | 83,742 | 180,242 |

Digital tuners according to the present invention can also be implemented using look-up table (LUT)-based programmable logic devices, such as the Altera FLEX 10K EPLD's, featuring embedded memory structures for implementing the cosine/sine LUTs. The memory structures, called embedded array blocks (EABs), contain 2K bits each. As such, the embodiment illustrated utilizes a total of 16 Embedded Array Blocks (EAB's) to implement the cosine/sine look-up tables 90. It may be necessary to split the tuner into in-phase and quadrature sections if enough EAB's are not available on a single logic device.

The number of gates required to implement the PCIC filters can be compared with FIR structures by first establishing similar requirements for equivalent FIR designs. A minimum in-band aliasing attenuation of 90 dB was established for the PCIC filters described above. In addition, Table 4 gives the maximum band edge attenuation requirement for each equivalent FIR filter based on the achievable limits for the PCIC approach. Table 4 also provides the minimum number of taps and coefficient bits needed to meet the specifications. The allowable number of taps was limited to values given by the equation 8I−1, where i is an integer. These values increase design efficiency by allowing pre-multiplication symmetric tap summing, and ease of conversion to a 4 input look-up table EPLD or FPGA design.

$$f_{clock} \leq f_{max}$$

A harmonic pair including adjacent harmonics of the clocking frequency is then selected based on the intermediate frequency of the tuner and the maximum frequency as represented by block 112. In the embodiment illustrated and described with reference to FIG. 4, the lower harmonic is determined according to:

$$n = ceil\left(\frac{f_{IF}}{f_{max}} - \frac{1}{2}\right)$$

where n represents the harmonic, $f_{IF}$ represents the intermediate frequency, $f_{max}$ represents the maximum frequency, and "ceil" represents a ceiling or rounding operation for rounding the parenthetical expression to the next highest integer. For example, ceil(2.0) returns the integer 2 (indicating the second harmonic for the lower harmonic of the harmonic pair) while ceil(2.01) returns the integer 3 (indicating the third harmonic for the lower harmonic of the harmonic pair).

Once the maximum frequency and lower harmonic have been determined, the clocking frequency is selected based

TABLE 4

FIR Filter Requirements vs. Signal Bandwidth

| Signal BW (2-sided) | Signal BW (1 sided) | Max. Band Edge Atten. (dB) | Min. No. of FIR Taps | Min. No. of Coef. Bits | FIR Version Gates/ Filter | FIR/PCIC Gate Ratio |
|---|---|---|---|---|---|---|
| 100 KHz | 50 KHz | 0.01 | 31 | 15 | 70,260 | 6.548 |
| 1 MHZ | 500 KHz | 0.01 | 31 | 15 | 70,520 | 3.328 |
| 10 MHZ | 5 MHZ | 0.80 | 39 | 14 | 79,930 | 1.657 |

Gate counts are then determined by decomposing the filters into the minimum possible number of adders and D flip flop's. The resulting gate count estimates indicate that a PCIC implementation has the greatest advantage over a FIR approach when the output bandwidth is relatively small compared to the output sample rate.

Figure 5:
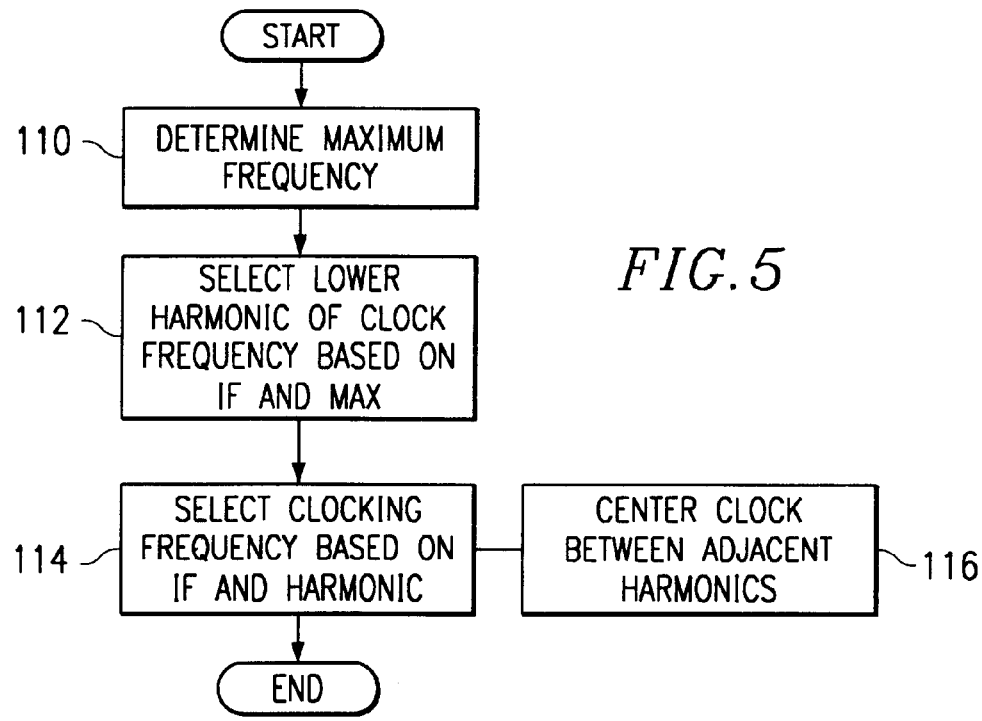
FIG. 5 is a flow chart illustrating a method for selecting a clock frequency for a digital tuner to enhance tuning bandwidth and reduce clock harmonic interference according to the present invention.

Referring now to FIG. 5, there is shown a flow chart illustrating a method for selecting a clocking frequency according to the present invention. The clocking frequency is selected to reduce clock harmonic interference thereby on the intermediate frequency and the lower harmonic as represented by block 114. to maximize the available tuning bandwidth while minimizing potential clock harmonic interference, the clocking frequency is preferably selected to substantially center the intermediate frequency within the harmonic pair, i.e. between two adjacent harmonics of the clocking frequency, as represented by block 116. This may be accomplished by selecting the clocking frequency according to:

$$f_{clock} = \frac{f_{IF}}{n+1/2}$$

where $f_{clock}$ represents the clocking frequency, $f_{IF}$ represents the intermediate frequency, and n represents the selected lower harmonic of the harmonic pair of the intermediate frequency.

Thus, those of skill in this art will recognize that PCIC-based tuners are ideal for a variety of applications, such as telemetry receivers, requiring a wide tuning bandwidth, low spurious levels, and constant group delay characteristics. The present invention allows 336 MSPS oversampling of a 70 MHZ IF. The high sample rate eases the design requirements of any antialiasing filter, providing greatly improved group delay characteristics when compared to an under-sampled approach. Direct sampling also eliminates the oscillators and mixers required for analog tuning techniques, which can generate undesired spurious signals through harmonics, coupling, and mixing processes. The PCIC approach of the present invention realizes the benefits of digital signal processing in high performance receiver design due to the availability of large arrays of custom and configurable logic.

While the best mode contemplated for practicing the invention has been described in detail, those familiar with the art to which this invention relates will recognize various alternative embodiments for practicing the invention as defined by the following claims.

What is claimed is:

1. A digital tuner having an enhanced tuning range for a predetermined intermediate frequency, the tuner comprising:

an analog to digital converter operating at an input clock frequency to sample an analog input signal and output a multi-bit digital word for each sample;

a demultiplexer coupled to the analog to digital converter for converting sequential multi-bit digital words to parallel multi-bit digital words;

a plurality of mixers reserving the parallel multi-bit digital words to separate the in-phase and quadrature-phase multi-bit digital words;

a plurality of local oscillators coupled to a corresponding plurality of mixers; and a parallel cascaded integrator comb filter coupled to the plurality of mixers for filtering parallel samples wherein the mixers, the local oscillators, and the parallel cascaded integrator comb filter operate at a frequency having adjacent harmonics substantially centered about the intermediate frequency.

2. The digital tuner of claim 1 wherein the plurality of mixers comprises a plurality of quadrature multipliers.

3. The digital tuner of claim 1 wherein each of the plurality of local oscillators comprises a phase accumulator and an associated storage media having cosine and sine look-up tables.

4. The digital tuner of claim 1 wherein the parallel cascaded integrator comb filter comprises:

a first parallel cascaded integrator comb filter for filtering an in-phase component of the input signal; and a second parallel cascaded integrator comb filter for filtering a quadrature component of the input signal.

5. The digital tuner of claim 1 wherein the plurality of local oscillators, the plurality of mixers, and the parallel cascaded integrator comb filter comprise a single logic device.

6. The digital tuner of claim 5 wherein the single logic device comprises a field programmable gate array.

7. The digital tuner of claim 5 wherein the single logic device comprises an embedded programmable logic device.

8. The digital tuner of claim 5 wherein the single logic device comprises an application specific integrated circuit.

9. The digital tuner of claim 1 further comprising:

a clock coupled to the mixers, the local oscillators, and the parallel cascaded integrator comb filter for providing a clocking signal having a frequency with adjacent harmonics substantially centered about the intermediate frequency.

* * * * *

UNITED STATES PATENT AND TRADEMARK OFFICE
CERTIFICATE OF CORRECTION

PATENT NO. : 6,647,075 B1
DATED : November 11, 2003
INVENTOR(S) : Thad J. Genrich It is certified that error appears in the above-identified patent and that said Letters Patent is hereby corrected as shown below:

Title page,
Item [56], References Cited, OTHER PUBLICATIONS, "*Apparatus and Method*" reference "Application Serial No. 09/538,354" should be -- Application Serial No. 09/358,354 --.

Column 1,
Line 22, "(FDR)" should be -- (FIR) --.

Column 2,
Line 40, "phase (I)" should be -- in-phase (I) --.

Column 4,
Line 16, "utilized in phase of" should be -- utilized in-phase of --;
Line 33, "decimation ration (R)" should be -- decimation ration (R) --;
Line 35, "frequency of $F_{OUT}=P*f_{IN}/R$" should be -- frequency of $f_{OUT}=P*f_{IN}/R$ --; and
Line 36, "ration R" should be -- ratio R --.

Column 5,
Line 16, "MHZ" should be -- MHz --;
Table 1, "1 MHZ" should be -- 1 MHz --;
Table 1, "10 MHZ" should be -- 10 MHz --;
Table 1, "5 MHZ" should be -- 5 MHz --; and
Table 1, "47 MHZ" should be -- 47 MHz --.

Column 6,
Line 6, "(serial CIC or FIR filter" should be -- (serial CIC or FIR) filter --.

Column 7,
Table 3, (last block), "Total Gates (2 tuners + LO/Multipliers)" should be -- Total Gates (2 tuners ÷ LO/Multipliers) --;
Table 4, "1 MHZ" should be -- 1 MHz --;
Table 4, "10 MHZ" should be -- 10 MHz --; and
Table 4, "5 MHZ" should be -- 5 MHz --;

UNITED STATES PATENT AND TRADEMARK OFFICE
CERTIFICATE OF CORRECTION

PATENT NO. : 6,647,075 B1
DATED : November 11, 2003
INVENTOR(S) : Thad J. Genrich It is certified that error appears in the above-identified patent and that said Letters Patent is hereby corrected as shown below:

Column 8,
Line 20, "$f_{clock} \leq f_{max}$" should be -- $f_{clock} \leq f_{max}$ --;
Line 34, "$f_{mas}$" should be -- $f_{max}$ --; and
Line 60, "block 114. to maximize" should be -- block 114. To maximize --.

Column 9,
Line 14, "70 MHZ IF." should be -- 70 MHz IF. --.

Signed and Sealed this

Tenth Day of August, 2004

JON W. DUDAS
*Acting Director of the United States Patent and Trademark Office*